(12) United States Patent
Ikari et al.

(10) Patent No.: US 10,553,405 B2
(45) Date of Patent: Feb. 4, 2020

(54) RING-SHAPED ELECTRODE

(71) Applicant: THINKON NEW TECHNOLOGY JAPAN CORPORATION, Tokyo (JP)

(72) Inventors: Atsushi Ikari, Shunan (JP); Satoshi Fujii, Tokyo (JP)

(73) Assignee: THINKON NEW TECHNOLOGY JAPAN CORPORATION, Tokyo (JP)

( * ) Notice: Subject to any disclaimer, the term of this patent is extended or adjusted under 35 U.S.C. 154(b) by 0 days.

(21) Appl. No.: 16/322,954

(22) PCT Filed: Jul. 28, 2017

(86) PCT No.: PCT/JP2017/027561
§ 371 (c)(1),
(2) Date: Feb. 3, 2019

(87) PCT Pub. No.: WO2018/025782
PCT Pub. Date: Feb. 8, 2018

(65) Prior Publication Data
US 2019/0172687 A1 Jun. 6, 2019

(30) Foreign Application Priority Data

Aug. 4, 2016 (JP) .................................. 2016-153988

(51) Int. Cl.
*H01J 1/02* (2006.01)
*H01J 37/32* (2006.01)
*H01L 21/67* (2006.01)

(52) U.S. Cl.
CPC .... *H01J 37/32559* (2013.01); *H01J 37/3255* (2013.01); *H01J 37/32541* (2013.01); *H01J 37/32605* (2013.01); *H01L 21/67069* (2013.01); *H01J 2237/334* (2013.01)

(58) Field of Classification Search
None
See application file for complete search history.

(56) References Cited

U.S. PATENT DOCUMENTS 6,818,097 B2 * 11/2004 Yamaguchi ............ C09J 163/00
156/345.47
2004/0163591 A1 8/2004 Nagayama et al.
2005/0167050 A1 8/2005 Oikawa
2009/0294064 A1 12/2009 Nagayama
2011/0023543 A1 2/2011 Umetsu et al.
(Continued)

FOREIGN PATENT DOCUMENTS

| JP | 2002-190466 | 7/2002 |
|---|---|---|
| JP | 2002-334866 | 11/2002 |
| JP | 2004-247361 | 9/2004 |

(Continued)

OTHER PUBLICATIONS

International Search Report dated Oct. 3, 2017 in International Application No. PCT/JP2017/027561.

*Primary Examiner* — Vip Patel
(74) *Attorney, Agent, or Firm* — Wentsler LLC

(57) ABSTRACT

A ring-shaped electrode includes a silicon ring body, and a cover body joined to at least a part of a surface of the ring body via a joining part, and having a better plasma resistance than silicon. The joining part has a heat resistance to withstand a temperature of at least 150° C., melts at 700° C. or below, and contains boron oxide.

5 Claims, 2 Drawing Sheets

(56) References Cited

U.S. PATENT DOCUMENTS

2012/0251759 A1    10/2012   Yamawaku et al.
2015/0107768 A1     4/2015   Uehara

FOREIGN PATENT DOCUMENTS

| | | |
|---|---|---|
| JP | 2005-217240 | 8/2005 |
| JP | 2008-251639 | 10/2008 |
| JP | 2009-290087 | 12/2009 |
| JP | 2011-003730 | 1/2011 |
| JP | 2011-032115 | 2/2011 |
| JP | 2011-100882 | 5/2011 |
| JP | 2012-204742 | 10/2012 |
| WO | 2014-007339 | 1/2014 |

\* cited by examiner

RING-SHAPED ELECTRODE

TECHNICAL FIELD

The present invention relates to a ring-shaped electrode, and particularly to an electrode used in a dry etching apparatus.

BACKGROUND ART

A dry etching apparatus using plasma is used as an etching apparatus in manufacture of a semiconductor integrated device such as an LSI. In this apparatus, while a wafer to be etched is disposed on a cathode of a planar electrode and etching gas is introduced into the apparatus, a high-frequency voltage is applied between a counter electrode (anode) and the cathode by a high-frequency oscillator, to thereby generate plasma of the etching gas between the electrodes. Positive ions serving as activated gas in the plasma enter a surface of the wafer, and etching is performed.

In the dry etching apparatus, metal contamination occurs when a metal component is used, and hence a silicon component is used. Representative examples of the silicon component are a focus ring that has a doughnut shape surrounding the wafer to be etched (Patent Literature 1), and a disc-like upper electrode (Patent Literature 2), for example. A focus ring for 300 mm wafer, which is mainly in current use, is expensive because the focus ring is fabricated from a silicon crystal ingot having a diameter of 320 mm or more.

CITATION LIST

Patent Literature

Patent Literature 1: Japanese Patent Laid-Open No. 2002-190466
Patent Literature 2: Japanese Patent Laid-Open No. 2005-217240

SUMMARY OF INVENTION

Technical Problem

When the above mentioned silicon component is exposed to plasma, a surface of the silicon component is etched and a thickness of the silicon component becomes thinner. Therefore, the silicon component is replaced in accordance with the decrease amount of the thickness, and the used silicon component is discarded. When replacement frequency of the silicon component increases as above, there has been a problem in that a period of stopping the dry etching apparatus is not only extended and manufacturing efficiency is not only reduced, but members that become used are also wasted every time.

An object of the present invention is to provide a ring-shaped electrode capable of reducing replacement frequency.

Solution to Problem

A ring-shaped electrode according to the present invention includes a silicon ring body, and a cover body joined to at least a part of a surface of the ring body via a joining part, and having a better plasma resistance than silicon. The joining part has a heat resistance to withstand a temperature of at least 150° C., melts at 700° C. or below, and contains boron oxide.

A ring-shaped electrode according to the present invention includes a silicon ring body, and a cover body joined to at least a part of a surface of the ring body via a joining part, and having a better plasma resistance than silicon. The joining part has a heat resistance to withstand a temperature of at least 150° C., melts at 700° C. or below, contains any of In, Sn, and Al, and is a eutectic alloy with silicon.

Advantageous Effects of Invention

According to the present invention, by including the cover body, silicon resistance is better than that of a conventional focus ring made of only silicon, and hence the replacement frequency can be reduced.

EMBODIMENT

An embodiment of the present invention is described below in detail with reference to the drawings.

Figure 1:
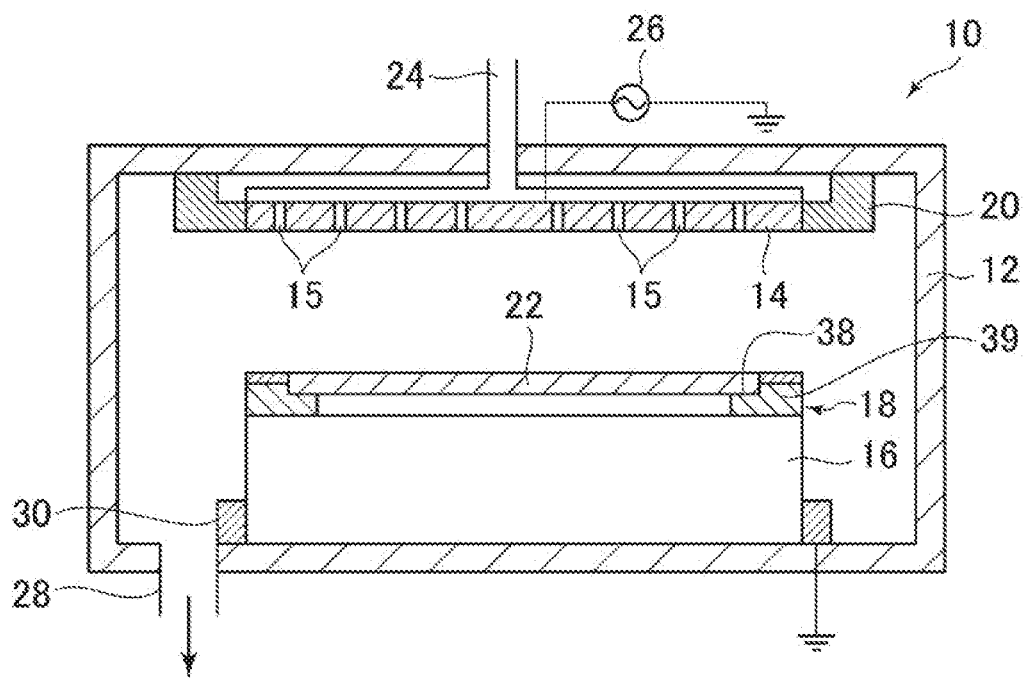
FIG. 1 is a cross-sectional view schematically illustrating a configuration of a dry etching apparatus including a ring-shaped electrode according to an embodiment.

A dry etching apparatus 10 illustrated in FIG. 1 includes a vacuum chamber 12, an electrode plate 14, a base 16, and a focus ring 18 as a ring-shaped electrode. The electrode plate 14 is a disc-like member, and is fixed to an upper part inside the vacuum chamber 12 by a support ring 20. The support ring 20 is made of silicon as an insulating member. The electrode plate 14 includes a plurality of through holes 15 each penetrating through the electrode plate 14 in a thickness direction. The electrode plate 14 is electrically connected with a high-frequency power supply 26. The electrode plate 14 is connected with a gas supply pipe 24. Etching gas supplied through the gas supply pipe 24 flows into the vacuum chamber 12 from the through holes 15 of the electrode plate 14, and is exhausted to outside from an exhaust port 28.

The base 16 is disposed at a lower part inside the vacuum chamber 12 and is surrounded by a ground ring 30. The ground ring 30 is made of silicon as an insulating member and is grounded. The focus ring 18 is provided on the base 16. The focus ring 18 is made of silicon as an insulating member, and a concave part 19 supporting a peripheral edge of a wafer 22 is provided over an entire inner circumference.

The dry etching apparatus 10 is supplied with the etching gas through the electrode plate 14. When the high-frequency voltage is applied from the high-frequency power supply 26, plasma is generated between the electrode plate 14 and the wafer 22. The surface of the wafer 22 is etched by this plasma.

Figure 2:
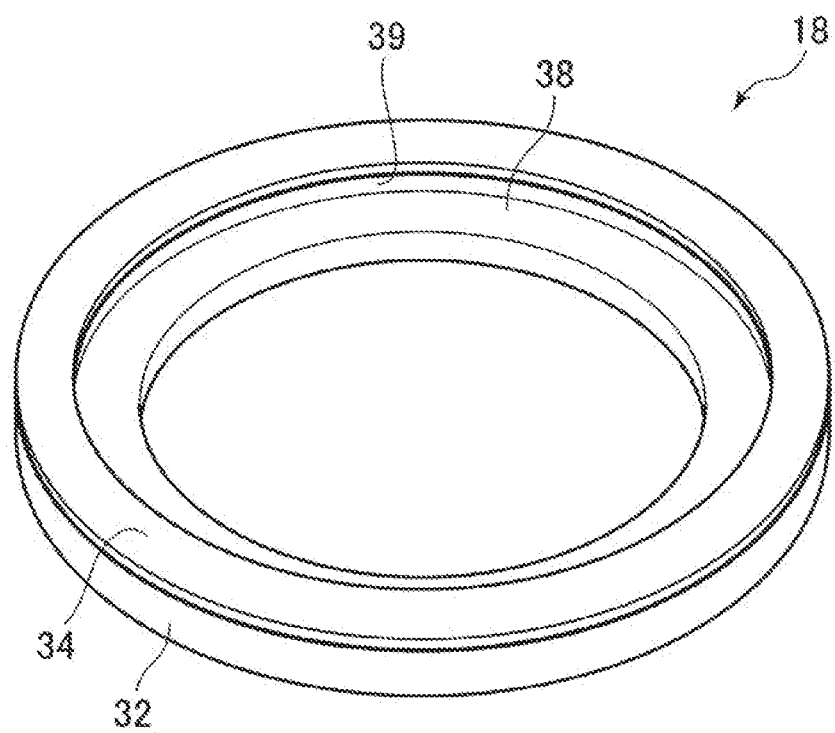
FIG. 2 is a perspective view illustrating a ring-shaped electrode according to the present embodiment.

As illustrated in FIG. 2, the focus ring 18 includes a ring body 32, and cover body 34 joined via a joining part (not illustrated in FIG. 2). The ring body 32 is made of silicon as an insulating member, and a concave part 38 supporting a peripheral edge of a wafer 22 is provided over an entire inner circumference of one side surface. The ring body 32 may be monocrystalline silicon or polycrystalline silicon. A manufacturing method, purity, crystal orientation, etc. thereof are not limited. The cover body 34 is provided on one side surface (convex part) except for the concave part 38. The cover body 34 is a ring-shaped member made of a material such as SiC having a better plasma resistance than silicon. The cover body 34 preferably has the same width as the convex part 39 of the ring body 32 so as to cover the convex part 39, and preferably has a thickness of 0.5 mm to 5.0 mm.

Figure 3:
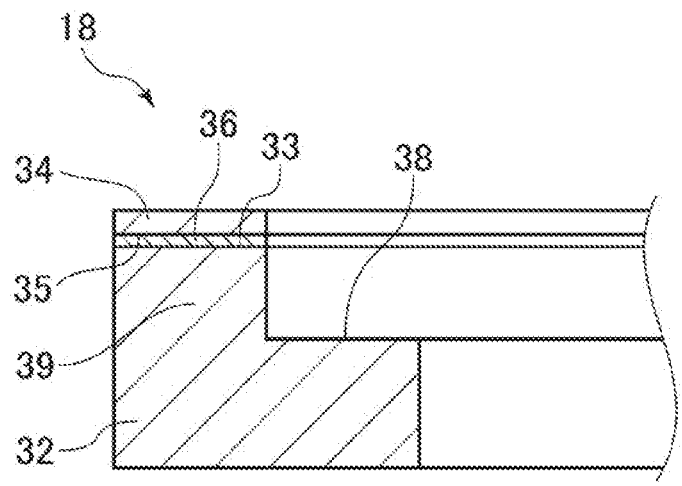
FIG. 3 is a partial cross-sectional view illustrating a joining part.

As illustrated in FIG. 3, a joining part 36 is provided between a surface (hereinafter also referred to as a joining surface) 33 of the convex part 39 of the ring body 32 and a joining surface 35 of the cover body 34. The joining part 36 has a heat resistance to withstand a temperature of at least 150° C., and melts at 700° C. or below. The joining part 36 more preferably has a heat resistance to withstand a temperature of 300° C. In the present embodiment, the joining part 36 is a eutectic alloy of silicon and silicon containing a metal forming the eutectic alloy with silicon. The metal forming a eutectic alloy with the silicon is any one of In, Sn, and Al (hereinafter also referred to as "alloying metal"). The purity of the alloying metal is not particularly limited as long as the alloying metal can form a eutectic with silicon, and the purity of the alloying metal is preferably 98% or more.

Next, a method of manufacturing the focus ring 18 is described. First, surface treatment is performed on the ring body 32 and the cover body 34. More specifically, surfaces of the ring body 32 and the cover body 34 are treated by grinding, polishing, or the like, to preferably form mirror surfaces. The surfaces of the ring body 32 and the cover body 34 may be etched by mixed solution of hydrofluoric acid and nitric acid. As the mixed solution, chemical polishing solution (hydrofluoric acid (49%):nitric acid (70%): acetic acid (100%)=3:5:3) standardized as JIS H 0609 may be used.

Subsequently, an alloying metal foil is disposed on the surface 33 of the convex part 39 of the ring body 32. A thickness of the alloying metal foil is preferably small in terms of reduction in energy for melting. The thickness of the alloying metal foil is preferably 0.1 μm to 100 μm, and more preferably 0.5 μm to 20 μm to exert joining strength. If the thickness of the alloying metal foil is lower than the above-described lower limit value, the alloying metal foil is easily damaged when disposed on the joining surfaces 33. If the thickness of the alloying metal foil is larger than the above-described upper limit value, a part where joining with silicon is insufficient is easily generated.

Subsequently, the cover body 34 is placed on the alloying metal foil. The cover body 34 is disposed so as to be coaxial with the ring body 32 that has been already disposed. In the above-described manner, the cover body 34 is superposed on the ring body 32 that has been already disposed via the alloying metal foil.

Next, heating is performed from the cover body 34 side, to thereby generate a melt containing silicon and the alloying metal. The heating method is not particularly limited, and the heating can be performed through resistance heating, optical heating, etc. The optical heating is preferable because positions to be heated can be easily shifted, and a heating amount can be easily changed based on the supplied power. For example, various kinds of lamps and lasers are used.

Figure 4:
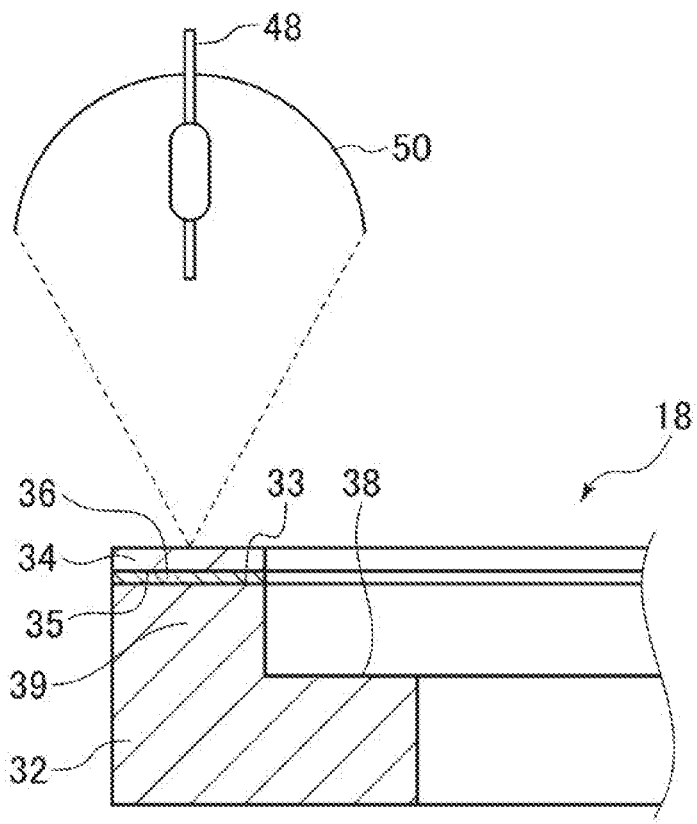
FIG. 4 is a cross-sectional view schematically illustrating an apparatus that manufactures the ring-shaped electrode.

In the present embodiment, an apparatus illustrated in FIG. 4 can be used. The apparatus illustrated in FIG. 4 includes at least one lamp 48 and at least one light condensing portion 50 that condenses light emitted from the lamp 48. As the lamp 48, a xenon lamp or a halogen lamp that is commonly used in an infrared crystal growth apparatus is usable. An output of the lamp is preferably about 1 kW to about 30 kW.

The heating is performed from upper side of the cover body 34. As long as the heating is performed from the upper side, the heating is not limited to be performed from the upper side in a direction perpendicular to the cover body 34, and the heating may be performed obliquely from the upper side. The alloying metal foil is first melted by the heating and a metal melt is generated. Next, the joining surfaces 33 and 35 of the cover body 34 and the ring body 32 in contact with the metal melt are affected by the metal melt, and a melt containing silicon is generated. It is considered that, when the heating is stopped and temperature is lowered, the melt is solidified while forming an alloy phase containing a eutectic, and joining is completed. For example, in a case where an Al foil is used, the ring body 32 and the cover body 34 can be sufficiently joined by heating up to about 800° C.

A light focusing region normally has a diameter of about 10 mm to about 30 mm. The diameter of the light focusing region is increased to about 30 mm to about 100 mm by shifting a light emission position of the lamp from a focal point of an elliptical mirror. The light focusing region thus expanded makes it possible to expand a heated range. It is preferred that heating be performed by moving the light focusing region to scan the entire surfaces of the metal foil, the ring body 32 and the cover body 34.

Next, the melt containing silicon and the alloying metal is cooled and solidified to generate the joining part 36 containing a eutectic alloy. The ring body 32 and the cover body 34 can be joined to one another to manufacture the focus ring 18.

When the alloying metal is Al and is cooled up to about 577° C., the joining part 36 containing Al-silicon eutectic (12.2 atomic % Al) is generated. A cooling speed depends on the alloying metal to be used. In the case where Al is used, the cooling speed is preferably controlled to 10° C. to 100° C./min. If the cooling speed is lower than the above-described lower limit value, a cooling time is lengthened and efficiency is low. If the cooling speed is higher than the above-described upper limit value, distortion tends to remain in the joining part 36.

The cooling speed can be controlled by gradually reducing the output of heating means after melting of the alloying metal foil is completed, and stopping the heating when the temperature of the joining part 36 is estimated to be lower than melting temperature of the eutectic. Such control of the heating temperature can be performed on the basis of a result of a measurement of relationship between power of the heating means and the temperature. The measurement is performed in advance, for example, while a thermocouple having a shape similar to the cover body 34 to be actually bonded is disposed between the ring body 32 and the cover body 34.

Generation of the melt by the heating and generation of the joining part 36 containing the eutectic alloy by the cooling described above are preferably performed inside a chamber of argon atmosphere of 10 torr to 200 torr (about 1333 Pa to about 26664 Pa) in order to prevent oxidation of the alloying metal and silicon. It is also possible to prevent oxidation by decompression without using argon gas; however, this is not preferable because decompression causes evaporation of silicon and the inside of the chamber may be contaminated. Further, oxidation can be prevented by nitrogen gas; however, this is not preferable because silicon is nitrided at temperature of 1200° C. or more.

The focus ring 18 obtained as described above is disposed in the vacuum chamber 12 of the dry etching apparatus 10, and is subjected to etching treatment. The thickness of the focus ring 18 decreases in accordance with frequency in use. The focus ring 18 is disposed in a state in which the cover body 34 is facing the wafer 22, and hence the thickness of the cover body 34 decreases. When the decrease amount in the thickness of the cover body 34 exceeds a predetermined value, the cover body 34 is replaced.

As described above, the focus ring 18 includes the cover body 34 made of SiC, and hence has a better durability than a focus ring of the related art made of only silicon. Therefore, the replacement frequency can be reduced.

The ring body 32 in the used focus ring 18 that has been replaced can be reused by replacing the cover body 34 with a new product with respect to the ring body 32. In order to replace the cover body 34 with a new product with respect to the ring body 32, the focus ring 18 is first heated to 600° C. or more, to thereby melt the joining part 36. Then, the cover body 34 is separated from the ring body 32. Next, the eutectic alloy is removed from the surface of the ring body 32 by grinding treatment. Then, the new focus ring 18 can be obtained by joining the cover body 34 to the ring body 32 by the same procedure as the method of manufacturing the above mentioned focus ring 18.

As described above, in the focus ring 18, the cover body 34 of which thickness has decreased can be replaced by reheating and melting the joining part 36. Therefore, in the focus ring 18, the ring body 32 can be reused, and hence the waste of the members that occurs by replacement can be reduced.

(Modification)

The present invention is not limited to the above-described embodiment, and can be modified, as appropriate, within the scope of the present invention.

The ring body 32 illustrated in FIG. 2 is an one-piece component, but the present invention is not limited thereto, and the ring body 32 may be formed by a silicon member partitioned into three or more parts in a circumferential direction. By partitioning the ring body 32 into three or more parts, the ring body 32 that is larger in size can be obtained with use of silicon members cut out from smaller silicon crystal ingots for wafer.

The cover body 34 illustrated in FIG. 2 is an one-piece component, but the present invention is not limited thereto, and the cover body 34 may be formed by a member partitioned into three or more parts in a circumferential direction.

In the above mentioned embodiment, the case where the cover body 34 is provided on the surface 33 of the convex part 39 of the ring body 32 has been described, but the present invention is not limited thereto, and the cover body 34 may be provided on any of the concave part 38, an inner peripheral surface, an outer peripheral surface, and the other side surface, or all of the surfaces.

In the above-described embodiment, the case where the ring body 32 and the cover body 34 are joined to each other with use of the alloying metal foil has been described, but the present invention is not limited thereto. It is considered that the electrode members can be joined to each other with use of powder or particles of the alloying metal.

In the above mentioned embodiment, the case where the joining part 36 contains alloying metal has been described, but the present invention is not limited thereto, and the joining part 36 may contain boron oxide. A method of manufacturing the focus ring 18 in the case where the joining part 36 contains boron oxide is described below.

First, the ring body 32 on which surface treatment is performed as in the above mentioned embodiment is heated to first temperature (180° C. to 280° C.), and a starting material made of particulate boric acid ($B(OH)_3$) is supplied to at least a part of the joining surface of the ring body 32. The ring body 32 can be heated by heating means using a common electric resistance heater. Since the temperature of the joining surface 33 is 180° C. to 280° C., dehydration reaction of boric acid occurs on the joining surface 33. Water is desorbed from boric acid in about 10 seconds to about 60 seconds, and metaboric acid ($HBO_2$) is accordingly generated. Metaboric acid is dissolved into the desorbed water to generate a liquid substance having excellent fluidity.

In a case where the temperature of the ring body 32 is excessively low, water cannot be desorbed from boric acid, and metaboric acid cannot be obtained. In contrast, in a case where the temperature of the ring body 32 is excessively high, water is quickly desorbed from boric acid. As a result, boric acid supplied to the joining surface 33 of the ring body 32 may be splattered or boric acid may be quickly solidified. When the first temperature is 180° C. to 280° C., it is possible to obtain metaboric acid in a more reliable manner. The first temperature is preferably 200° C. to 240° C.

As the starting material made of particulate boric acid, granular boric acid having a diameter of 0.1 mm to 2 mm sold on the open market can be used as it is. When the starting material made of boric acid having a diameter of 0.1 mm to 2 mm is supplied to the joining surface 33 of the ring body 32 heated to the first temperature, it is possible to form a layer containing metaboric acid described later. Boric acid is preferably supplied little by little to a part of the joining surface 33 of the ring body 32.

The liquid substance that has been generated through desorption of water from boric acid is spread by a spatula to form the layer containing metaboric acid. As described above, boric acid as the starting material is supplied little by little to the joining surface 33 of the ring body 32 and the generated liquid substance is spread every time. As a result, it is possible to form the uniform layer containing metaboric acid on the joining surface 33. A cut wafer is used as the spatula, which makes it possible to avoid mixture of impurity into the layer containing metaboric acid.

A thickness of the layer containing metaboric acid is preferably 1 mm or less, and more preferably 0.1 mm to 0.5 mm. Generation of bubbles caused by dehydration reaction can be suppressed when heating is performed in a subsequent step as the thickness of the layer containing metaboric acid is smaller. The thickness of the layer containing metaboric acid can be adjusted by controlling an amount of boric acid to be supplied as the starting material.

The ring body 32 that has been provided with the layer containing metaboric acid on the joining surface 33 is heated to increase its temperature to second temperature (500° C. to 700° C.). As a result, water is further desorbed from metaboric acid, and a melt containing boron oxide ($B_2O_3$) is accordingly generated. In a case where the second temperature is excessively high, the ring body 32 and the cover body 34 may be cracked due to difference of thermal expansion coefficients between boron oxide and silicon when cooling is performed in a subsequent step. In the case where the second temperature is 500° C. to 700° C., it is possible to obtain the melt containing boron oxide in a more reliable manner. The second temperature is preferably 550° C. to 600° C.

The cover body 34 on which surface treatment is performed is press-bonded on the melt containing boron oxide generated on a joining region of the ring body 32. Pressure in press-bonding is not particularly limited, and can be set as appropriate.

When the melt of boron oxide is solidified, the ring body 32 and the cover body 34 are joined to each other by the boron oxide layer. The melt is solidified, for example, when left at room temperature. By generating the joining part 36 in the above-described manner, the focus ring 18 can be manufactured.

In order to replace the focus ring 18 with a new product, the cover body 34 is separated from the ring body 32 by first heating the focus ring 18 to 500° C. or more and melting the joining part 36, or by immersing the focus ring 18 in water for a long time and eluting the boron oxide. Next, the boron oxide layer is removed by wiping the surface of the ring body 32 with use of cloth containing water or ethanol. Then, the new focus ring 18 can be obtained by joining the cover body 34 to the ring body 32 by the same procedure as above.

The layer containing metaboric acid may be formed not over the entire region of the joining surfaces 33 and 35 of the ring body 32 and the cover body 34 but in a frame shape along an outer edge of the joining surfaces 33 and 35. The width of the frame-shaped layer containing metaboric acid can be 5 mm to 10 mm. The alloying metal foil is disposed in a region inside the frame-shaped layer containing metaboric acid. Before the alloying metal foil is disposed in the inside region, the frame-shaped layer containing metaboric acid may be cooled and the surface thereof may be polished to reduce the thickness. The frame-shaped layer containing metaboric acid is formed on the joining surface 33 of the ring body 32, and the alloying metal foil is disposed. Thereafter, the cover body 34 is disposed, and heating up to eutectic temperature or more and 700° C. or less is performed. The alloying metal forms a eutectic with silicon by the heating, and hence the ring body 32 and the cover body 34 can be joined to each other in a firmer manner. The eutectic alloy formed at this time is surrounded by the frame-shaped boron oxide layer. Therefore, the metal is hardly dispersed to cause contamination. Also in this case, as in the above mentioned embodiment, the cover body 34 can be replaced with a new product with respect to the ring body 32.

In the above mentioned embodiment, the case where the ring-shaped electrode is applied to the focus ring has been described, but the present invention is not limited thereto. For example, the ring-shaped electrode can be applied to a support ring and a ground ring, and further to a silicon member that is placed inside the vacuum chamber of the dry etching apparatus and is supplied with voltage or is grounded.

REFERENCE SIGNS LIST

10 Dry etching apparatus
18 Focus ring (ring-shaped electrode)
32 Ring body
34 Cover body
36 Joining part
38 Concave part
39 Convex part

The invention claimed is:

1. A ring-shaped electrode, comprising:
    a silicon ring body; and
    a cover body joined to at least a part of a surface of the ring body via a joining part, and having a better plasma resistance than silicon, wherein the joining part has a heat resistance to withstand a temperature of at least 150° C., melts at 700° C. or below, and contains boron oxide.

2. A ring-shaped electrode, comprising:
    a silicon ring body; and
    a cover body joined to at least a part of a surface of the ring body via a joining part, and having a better plasma resistance than silicon, wherein the joining part has a heat resistance to withstand a temperature of at least 150° C., melts at 700° C. or below, contains any of In, Sn, and Al, and is a eutectic alloy with silicon.

3. The ring-shaped electrode according to claim 1, wherein the joining part contains any of In, Sn, and Al, and contains a eutectic alloy with silicon.

4. The ring-shaped electrode according to claim 1, wherein:
    the ring body has, on one side surface, a concave part on which a wafer is placed; and
    the cover body is at least disposed on the one side surface except for the concave part.

5. The ring-shaped electrode according to claim 2, wherein:
    the ring body has, on one side surface, a concave part on which a wafer is placed; and
    the cover body is at least disposed on the one side surface except for the concave part.

* * * * *